United States Patent
Giove et al.

(10) Patent No.: US 6,801,466 B2
(45) Date of Patent: Oct. 5, 2004

(54) CIRCUIT FOR CONTROLLING A REFERENCE NODE IN A SENSE AMPLIFIER

(75) Inventors: Salvatore Giove, Bari (IT); Luca De Ambroggi, Catania (IT); Salvatore Nicosia, Palermo (IT); Francesco Tomaiulo, Monte Sant' Angelo (IT); Kumar Promod, Catania (IT); Giuseppe Piazza, Sciacca (IT); Francesco Pipitone, Palermo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/331,147

(22) Filed: Dec. 27, 2002

(65) Prior Publication Data

US 2003/0142568 A1 Jul. 31, 2003

(30) Foreign Application Priority Data

Dec. 28, 2001 (EP) ............................. 01830817

(51) Int. Cl.$^7$ .............................. G11C 7/02; G11C 7/00; G01R 19/00; H03F 3/45
(52) U.S. Cl. ............. 365/207; 365/185.21; 365/185.25; 365/189.07; 365/189.09; 365/203; 365/207; 365/208; 365/229; 327/52; 327/53; 327/56
(58) Field of Search ................. 365/185.2, 185.21, 365/185.25, 189.07, 189.09, 203, 207, 208; 327/52, 53, 56

(56) References Cited

U.S. PATENT DOCUMENTS

| | | | |
|---|---|---|---|
| 6,052,307 A | 4/2000 | Huber et al. | 365/185.21 |
| 6,507,523 B2 * | 1/2003 | Pekny | 365/189.09 |
| 2001/0006479 A1 | 7/2001 | Ikehashi et al. | 365/185.24 |

* cited by examiner

Primary Examiner—Van Thu Nguyen
(74) Attorney, Agent, or Firm—Allen, Dyer, Doppelt, Milbrath & Gilchrist, P.A.; Lisa K. Jorgenson

(57) ABSTRACT

A circuit for controlling a reference node in a sense amplifier switchable between an operating mode and a stand-by mode is provided. The reference node provides a reference voltage in the operating mode. The circuit may include circuitry for bringing the reference node to a starting voltage upon entry into the stand-by mode, circuitry for keeping the reference node at a pre-charging voltage in the stand-by mode, and circuitry for providing a comparison voltage closer to the pre-charging voltage than the starting voltage. Pulling circuitry may also be included for pulling the reference node toward a power supply voltage. Further, a controller may activate the pulling circuitry upon entering the stand-by mode, and disable the pulling circuitry when the voltage at the reference node reaches the comparison voltage.

37 Claims, 4 Drawing Sheets

CIRCUIT FOR CONTROLLING A REFERENCE NODE IN A SENSE AMPLIFIER

FIELD OF THE INVENTION

The present invention relates to the field of electrical devices, and, more particularly, to a circuit for controlling a reference node in a sense amplifier.

BACKGROUND OF THE INVENTION

Sense amplifiers are commonly used in several applications, such as for reading cells of a non-volatile memory device, for example. A sense amplifier includes a circuit that detects a low-level signal and compares it with a pre-set reference voltage. The sense amplifier outputs a signal having two different values according to the result of the comparison.

Typically, the sense amplifier enters a stand-by condition or mode after a pre-set period has lapsed from a last reading operation. In particular, most of the elements of the sense amplifier are switched off (bringing a reference node providing the reference voltage to a power supply reference value, or ground), to reduce the power consumption of the device in which the sense amplifier is embedded. This also serves to reduce stress on the reference cells commonly used for generating the reference voltage.

When the sense amplifier is used in high performance devices, such as non-volatile memories with an access time lower than a few tens of ns, for example, it is very important to bring the voltage at the reference node back to its working value as quickly as possible after exiting a stand-by mode. In this case, the reference node is pre-charged in the stand-by mode to improve a dynamic response of the sense amplifier. Particularly, the reference node is connected to the central tap of a voltage divider providing a pre-charging voltage having a value close to the reference voltage.

Yet, the reference node is generally associated with a stray capacitor having a non-negligible capacitance. Therefore, its pre-charging under the action of the voltage divider is very slow since the voltage divider has to provide a low power consumption in the stand-by mode. This problem is particularly acute in a flash electrically erasable programmable read only memory (EEPROM), where a single reference node is used for all the sense amplifiers of the device. The single reference node is then associated with a stray capacitor having a relatively high capacitance defined by all of the memory cells.

A known prior art approach for speeding up the pre-charging process includes connecting the reference node to a capacitor charged at a power supply voltage upon entry into the stand-by mode. In this way, if the capacitor is suitably dimensioned, the reference node is instantaneously brought to the pre-charging voltage by charge sharing between this capacitor and the stray capacitor associated with the reference node.

A drawback of this prior art pre-charging circuit is that its operation is totally dependent on the stray capacitance associated with the reference node. Yet, it is very difficult (if not impossible) to estimate this value with precision. As a result, when the pre-charging circuit is not dimensioned correctly, the reference node is brought to a voltage that is quite different from the desired value. Therefore, the reference node will reach the pre-charging voltage very slowly and only under the action of the voltage divider.

Moreover, if the sense amplifier exits from the stand-by mode before completion of the aforementioned transient process, the voltage at the reference node will be at a value different from the expected one. In addition, the voltage at the reference node will vary widely according to the length of the stand-by mode. This causes spikes and surges which increase the time needed for the voltage at the reference node to reach its correct value upon exiting the stand-by mode.

SUMMARY OF THE INVENTION

It is an object of the present invention to overcome the above-mentioned drawbacks, i.e., to provide desired pre-charging in a relatively short period of time.

This and other object, features, and advantages in accordance with the invention are provided by a circuit for controlling a reference node in a sense amplifier that is switchable between an operating mode and a stand-by mode, where the reference node provides a reference voltage in the operating mode. The circuit may include means or circuitry for bringing the reference node to a starting voltage upon entry into the stand-by mode, first means or circuitry for keeping the reference node at a pre-charging voltage in the stand-by mode, and second means or circuitry for providing a comparison voltage closer to the pre-charging voltage than the starting voltage. The circuit may also include pulling means or circuitry for pulling the reference node toward a power supply voltage, and control means or circuitry for activating the pulling means upon entry into the stand-by mode and for disabling the pulling means when the voltage at the reference node reaches the comparison voltage.

Moreover, the present invention also provides a sense amplifier including a circuit as briefly described above, as well as a non-volatile memory device including such a sense amplifier. The invention also provides a corresponding method of controlling a reference node in a sense amplifier.

BRIEF DESCRIPTION OF THE DRAWINGS

Further features and the advantages in accordance with the present invention will be understood with reference to the following description of a preferred embodiment thereof, given purely by way of non-limiting example, with reference to the attached figures, in which.

DETAILED DESCRIPTION OF THE PREFERRED EMBODIMENTS

Figure 1:
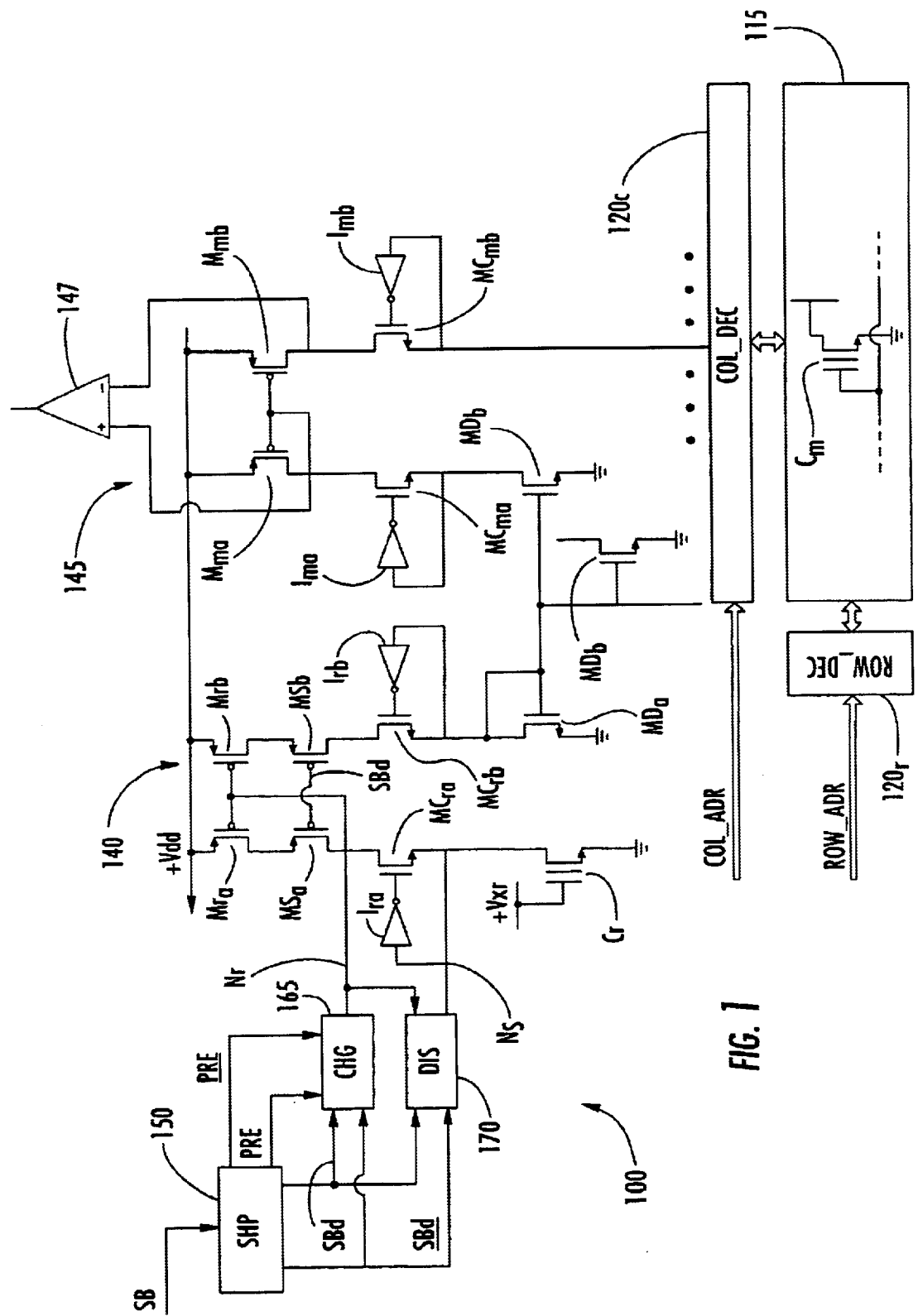
FIG. 1 is a schematic block diagram of a reading section of a non-volatile memory device including a circuit in accordance with the present invention.

Turning now to FIG. 1, a reading section of a memory device 100 (e.g., a flash EEPROM) is illustratively shown. The memory device 100 includes a matrix 115 of memory cells Cm including floating gate MOS transistors. The memory device 100 has a so-called NOR architecture. The source terminals of all the memory cells Cm are connected to a common source line (typically at ground). The control gate terminals of the memory cells Cm of each row are connected to a corresponding word line. The drain terminals of the memory cells Cm of each column are connected to a corresponding bit line. The bit lines are grouped into a series of packets, each one for a bit of a word that is simultaneously processed by the memory device 100.

A column decoder (COL_DEC) 120c is used to select the bit lines of a word in response to a column address COL_ADR. A row decoder (ROW_DEC) 120r is likewise used to select a word line in response to a row address ROW_ADR. The column decoder 120c is connected to a reading unit which outputs a word read from the matrix 115, which is defined by the values stored on the selected memory cells Cm.

The reading unit includes a single reference cell Cr (i.e., a floating gate MOS transistor) for all the memory cells Cm of the matrix 115. The reference cell Cr has a control gate terminal that is fed by a voltage +Vxr (e.g., 4.5V with respect to ground), which is higher than a power supply voltage +Vdd (e.g., 3.3V). A source terminal of the reference cell Cr is taken at ground, whereas a drain terminal of the reference cell Cr is connected to the first branch of a reference sense amplifier 140.

The reference sense amplifier 140 includes a drain voltage regulator with a cascode configuration which is formed by an n-channel MOS (or NMOS) transistor MCra having a source terminal connected to the drain terminal of the reference cell Cr. An inverter Ira has an input terminal and an output terminal connected to the source terminal and to the gate terminal, respectively, of the NMOS transistor MCra. A current mirror is formed by a p-channel MOS (or PMOS) transistor MSa (operating as a switch), which has a drain terminal connected to the drain terminal of the NMOS transistors MCra.

The source terminal of the PMOS transistor MSa is connected to a drain terminal of a further PMOS transistor Mra. The source terminal of the PMOS transistor Mra is fed by the power supply voltage +Vdd. The gate terminal of the PMOS transistor Mra is short circuited to the drain terminal of the PMOS transistor MSa and to the gate terminal of a further PMOS transistor Mrb. The PMOS transistor Mrb has a source terminal that is fed by the power supply voltage +Vdd, and a drain terminal that is connected to the source terminal of a PMOS transistor MSb (operating as a switch). The gate terminal of the PMOS transistor MSb is short circuited to the gate terminal of the PMOS transistor Msa. The drain terminal of the PMOS transistor MSb is connected to a further voltage regulator which is formed by an NMOS transistor MCrb and an inverter Irb.

Multiple decoupling current mirrors are formed by an NMOS transistor MDa having the drain terminal connected to the voltage regulator MCrb, Irb and the source terminal taken at ground. The gate terminal of the NMOS transistor MDa is short circuited to its drain terminal and to a gate terminal of a series of NMOS transistors MDb, each one for a corresponding packet of bit lines. The NMOS transistor MDb has the source terminal taken at ground, and the drain terminal is connected to a corresponding sense amplifier 145 for reading the memory cells Cm connected to the bit lines of the packet.

The sense amplifier 145 includes a voltage regulator Mcma, Ima connected between the NMOS transistor MDb and a first branch of a current mirror (referred to the power supply voltage +Vdd), which is formed by two PMOS transistors Mma and Mmb. The current mirror Mma, Mmb has a second branch connected to the column decoder 120c through a further voltage regulator MCmb, Imb. The current mirror Mma, Mmb has a structure with unbalanced loads, where the PMOS transistor Mma (on a reference side) is larger, and has lower resistance, than the PMOS transistor Mmb (on a memory cell side).

The drain terminal of the PMOS transistor Mma and the drain terminal of the PMOS transistor Mmb are connected to the non-inverting input terminal and to the inverting input terminal, respectively, of a comparator 147. The output terminal of the comparator 147 provides a bit of the word read from the matrix 115.

A stand-by signal SB (generated by a state machine, not shown in the figure, which controls operation of the memory device 100) is supplied to a wave-shaping block (SHP) 150. The signal SB is used to switch off most of the circuits of the memory device 100 after a pre-set inactivity period (to reduce stress on the reference cell Cr and power consumption of the memory device 100). The wave-shaping block 150 outputs a delayed signal SBd and a pre-enabling signal PRE along with their inverted signals SBd and PRE. The signal SBd is obtained from the signal SB by delaying its leading edge (e.g., for a few ns), but without affecting its trailing edge. The signal PRE is a short pulse (e.g., a few ns) which is triggered by the leading edge of the signal SBd.

The signal SBd is supplied to the gate terminals of the PMOS transistors MSa and MSb. A pre-charging block (CHG) 165 controls a reference node Nr, which is defined by the drain terminal of the PMOS transistor MSa, in response to the signals SBd, PRE, SBd and PRE. A discharging block (DIS) 170 controls a further node Ns, which is defined by the source terminal of the PMOS transistor MCra, in response to the signals SBd, SBd and according to the voltage at the node Nr.

During operation of the memory device 100, the signal SB and then also the signal SBd are at a low voltage, so that the PMOS transistors MSa and MSb are both on. The current flowing through the reference cell Cr (which is always on) is transferred by the current mirrors MSa, Msb; Mra, Mrb; and MDa, MDb to the reference side of each sense amplifier 145.

When a word is to be read, the corresponding bit lines selected by the column address COL_ADR are biased to a reading voltage (e.g., 1V), while the other bit lines are left floating. The word line selected by the row address ROW_ADR is driven to the power supply voltage +Vdd, while the other word lines are kept at ground. The current flowing through the bit line of each selected memory cell Cm is compared with the current supplied by the reference cell Cr.

More particularly, the reference cell Cr is conductive since it is not programmed and has a low threshold voltage. Thus, the current flowing through the reference side of the sense amplifier 145 generates a voltage at the non-inverting input of the comparator 147 which is equal to the supply voltage +Vdd minus the voltage drop across the PMOS transistor Mma. When the selected memory cell Cm is similarly not programmed, the same current flows through the corresponding bit line. However, the voltage drop across the PMOS transistor Mmb is higher than the drop across the PMOS transistor Mma.

As a result, the voltage at the inverting input of the comparator 147 is lower than the voltage at its non-inverting input terminal, and the comparator 147 outputs a high voltage (logic value 1). Conversely, when the selected memory cell Cm is programmed, it has a high threshold voltage and is not conductive. As a result, the inverting input terminal of the comparator 147 is driven to the supply voltage +Vdd (which is higher than the voltage at its non-inverting input terminal), and the comparator 147 outputs a low voltage (e.g., a logic value 0).

In both cases, the voltage at the inverting input terminal of the comparator 147 is different than the voltage at its non-inverting input terminal to ensure a correct operation of the comparator 147. Similar considerations apply if the memory device has a different structure (e.g., a NAND architecture), if the sense amplifiers have a different configuration (e.g., without any voltage regulator), if the NMOS and PMOS transistors are replaced with equivalent components, if two or more reference cells are used, if the reference cell is directly coupled to the sense amplifiers (without any current mirror), etc.

Figure 2A:
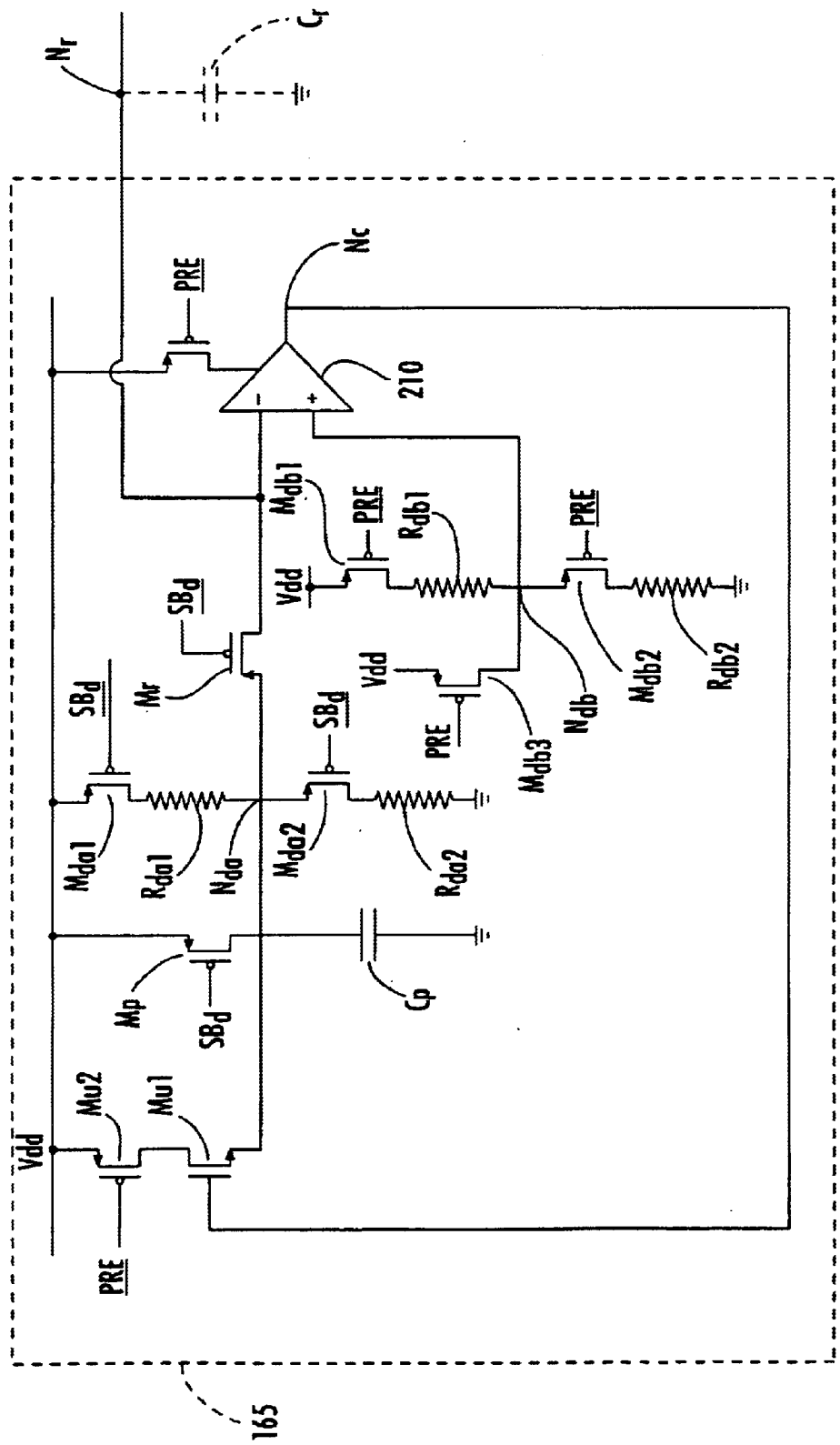
FIGS. 2A and 2B are schematic circuit diagrams illustrating a pre-charging block and a discharging block, respectively, of a sense amplifier in accordance with the present invention.

Referring now to FIG. 2A, a stray capacitance Cr is associated with the node Nr (as shown in dashed lines between the node Nr and ground). The stray capacitance Cr is relatively high due to the fact that the reference node Nr is associated with all the cells of the memory device. The pre-charging block 165 includes a PMOS transistor Mr having the drain terminal connected to the node Nr and the gate terminal controlled by the signal SBd. The source terminal of the PMOS transistor Mr is connected to a central tap (node Nda) of a voltage divider formed by two resistors Rda1 and Rda2 in series. Particularly, the resistor Rda1 is connected between the node Nda and the drain terminal of a PMOS transistor Mda1, whose source terminal is fed by the power supply voltage +Vdd. The resistor Rda2 is connected between ground and the drain terminal of a PMOS transistor Mda2, whose source terminal is connected to the node Nda. The gate terminals of both PMOS transistors Mda1 and Mda2 are controlled by the signal SBd.

A capacitor Cp is connected between the node Nda and ground. The node Nda is further connected to the drain terminal of a PMOS transistor Mp, whose source terminal is fed by the power supply voltage +Vdd. The gate terminal of the PMOS transistor Mp is controlled by the signal SBd.

An additional voltage divider having a central tap defining a node Ndb is formed by two resistors Rdb1 and Rdb2 in series. The resistor Rdb1 is connected between the node Ndb and the drain terminal of a PMOS transistor Mdb1, whose source terminal is fed by the power supply voltage +Vdd. The resistor Rdb2 is connected between ground and the drain terminal of a PMOS transistor Mdb2, whose source terminal is connected to the node Ndb. The gate terminals of both PMOS transistors Mdb1 and Mdb2 are controlled by the signal PRE. The node Ndb is further connected to the drain terminal of a PMOS transistor Mdb3, whose source terminal is fed by the power supply voltage +Vdd. The gate terminal of the PMOS transistor Mdb3 is controlled by the signal PRE.

The node Nr and the node Ndb are connected to the inverting input terminal and to the non-inverting input terminal, respectively, of a comparator 210. A supply terminal of the comparator 210 is connected to the drain terminal of a PMOS transistor Mpc, whose source terminal is fed by the power supply voltage +Vdd. The gate terminal of the PMOS transistor Mpc is controlled by the signal PRE. The output terminal of the comparator 210 (node Nc) controls a pull-up NMOS transistor Mu1. The source terminal and the drain terminal of the NMOS transistor Mu1 are connected to the node Nda and to the drain terminal of a PMOS transistor Mu2, respectively. The source terminal of the PMOS transistor Mu2 is fed by the power supply voltage +Vdd. The gate terminal of the PMOS transistor Mu2 is controlled by the signal PRE.

Figure 2B:
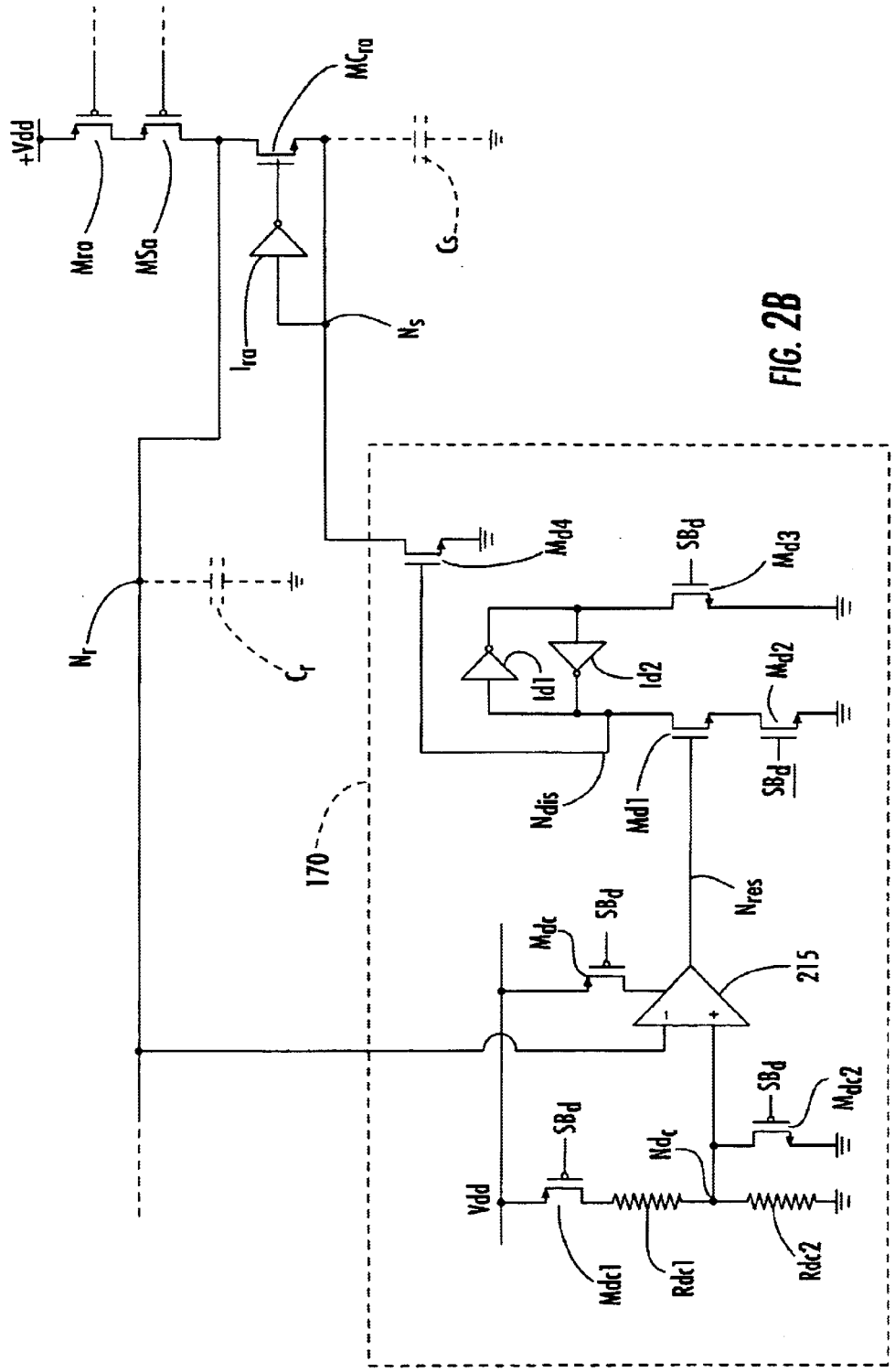

Turning now to FIG. 2B, the discharging block 170 includes a voltage divider (having a central tap defining a node Ndc), which is formed by two resistors Rdc1 and Rdc2 connected in series. Particularly, the resistor Rdc1 is connected between the node Ndc and the drain terminal of a PMOS transistor Mdc1, whose source terminal is fed by the power supply voltage +Vdd. The resistor Rdc2 is connected between the node Ndc and ground. An NMOS transistor Mdc2 has a source terminal and a drain terminal connected to ground and to the node Ndc, respectively. The gate terminals of both the PMOS transistor Mdc1 and the NMOS transistor Mdc2 are controlled by the signal SBd.

The node Nr and the node Ndc are connected to the inverting input terminal and to the non-inverting input terminal, respectively, of a comparator 215. A supply terminal of the comparator 215 is connected to the drain terminal of a PMOS transistor Mdc, whose source terminal is fed by the power supply voltage +Vdd. The gate terminal of the PMOS transistor Mdc is controlled by the signal SBd.

The output terminal of the comparator 215 (node Nres) controls an NMOS transistor Md1. The source terminal of the NMOS transistor Md1 is connected to the drain terminal of an NMOS transistor Md2, whose source terminal is connected to ground. The gate terminal of the NMOS transistor Md2 is controlled by the signal SBd. Two inverters Id1 and Id2 are connected in a latch configuration between the NMOS transistor Md1 and a further NMOS transistor Md3. Particularly, the input terminal of the inverter Id1 and the output terminal of the inverter Id2 are connected to the drain terminal of the NMOS transistor Md1.

The input terminal of the inverter Id2 and the output terminal of the inverter Id1 are connected to the drain terminal of the NMOS transistor Md3. The source terminal of the NMOS transistor Md3 is connected to ground. The gate terminal of the NMOS transistor Md3 is controlled by the signal SBd. The drain terminal of the NMOS transistor Md1 (node Ndis) controls the gate terminal of a pull-down NMOS transistor Md4. The source terminal and the drain terminal of the NMOS transistor Md4 are connected to ground and to the node Ns, respectively. A stray capacitance Cs defined by the reference cell is associated with the node Ns (as shown in dashed lines between the source terminal of the transistor MCra and ground).

It should be noted that similar considerations apply for different configurations. For example, such configurations may include: if the pre-charging block and the discharging block have a different structure (e.g., replacing the pull-up transistor or the pull-down transistor with equivalent circuitry), if the latch is formed by different elements, if the resistors have different resistance, if the voltage dividers are not resistive (e.g., they are implemented with MOS transistors), etc.

Figure 3:
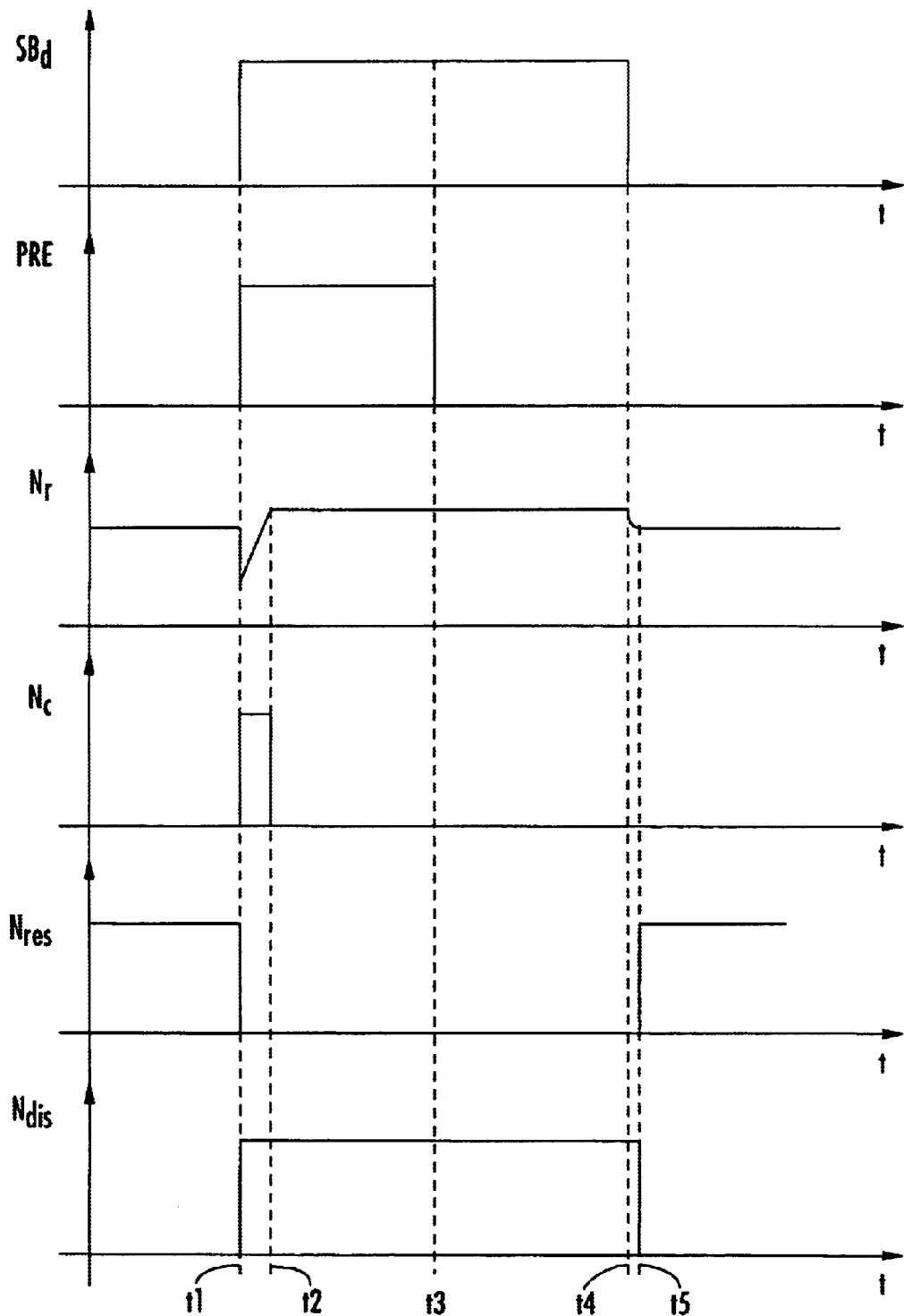
FIG. 3 is a signal diagram illustrating wave shapes relating to certain electrical quantities of the sense amplifier of FIGS. 2A and 2B.

As may be seen in FIG. 3, in an operating mode of the memory device the signals SB, SBd, PRE are at low voltage, and then the inverted signals SBd, PRE are at high voltage. In this mode, the pre-charging block 165 is disabled and disconnected from the node Nr (transistors Mr, Mda1 and Mda2, Mdb1 and Mdb2, Mpc, and Mu2 off). The capacitor Cp is charged to the power supply voltage +Vdd (through the PMOS transistor Mp), and the node Ndb is kept at the power supply voltage +Vdd by the PMOS transistor Mdb3.

When the memory device enters the stand-by mode, the signal SB is switched to a high voltage. After a pre-set period (time t1), the signals SBd, PRE are brought to a high voltage, and then the inverted signals SBd, PRE are brought to a low voltage (to avoid glitches in the signals). In response thereto, the PMOS transistor Mp is switched off and the PMOS transistors Mr, Mda1, Mda2 are switched on so that the node Nr instantaneously goes (by charge sharing between the capacitors Cp and Cr) to a starting voltage defined by:

$$\frac{Cp \cdot Vdd + Cr \cdot Vref}{Cp + Cr}.$$

The capacitance of the capacitor Cp is set to a value to ensure that the starting voltage is lower (e.g., 0.5V) than a pre-charging voltage Vpre of the node Nr in a steady state, which is defined by the voltage divider Rda1, Rda2 as follows:

$$V_{pre} = \frac{Vdd \cdot Rda2}{Rda1 + Rda2}.$$

The resistors Rda1, Rda2 have high resistances (e.g., several hundreds of kΩ) to reduce the power consumption of the memory device in the stand-by mode. The voltage divider Rda1, Rda2 thus has a very slow dynamic response due to the fact that it drives a relatively high capacitive load (defined by the capacitors Cp and Cr). Moreover, the resistors Rda1, Rda2 are dimensioned so that the pre-charging voltage Vpre has a value close to the reference voltage Vref (typically higher then the reference voltage Vref, e.g., 0.1V).

At the same time, the PMOS transistors Mdb1, Mdb2 are switched on and the PMOS transistor Mdb3 is switched off so that the node Ndb is brought from the power supply voltage +Vdd to the voltage defined by:

$$\frac{Vdd \cdot Rdb2}{Pdb1 + Rdb2}.$$

The resistors Rdb1, Rdb2 also have high resistances (e.g., several hundreds of kΩ). However, the voltage divider Rdb1, Rdb2 has a very fast dynamic response since it drives a low capacitive load (defined by the non-inverting input terminal of the comparator 210). The resistors Rdb1, Rdb2 are dimensioned so that the voltage at the node Ndb is substantially the same as the pre-charging voltage Vpre. In particular, the voltage at the node Ndb has a value slightly lower than the pre-charging voltage Vpre (e.g., a few tens of mV, such as 50 mV) to compensate for an input offset voltage of the comparator 210.

Moreover, the PMOS transistor Mpc is switched on, which supplies the comparator 210. The voltage at its inverting input terminal (node Nr) is lower than the voltage at its non-inverting input terminal (node Ndb), and the node Nc is then brought to high voltage. Therefore, both the transistors Mu1 and Mu2 are switched on so that the node Nr is pulled up towards the power supply voltage +Vdd.

As soon as the voltage at the node Nr reaches the voltage at the node Ndb (time t2), the node Nc is brought to a low voltage and the NMOS transistor Mu1 is switched off. The node Nr is then maintained at the pre-charging voltage Vpre by the voltage divider Rda1 and Rda2. At a next time t3, the signal PRE is brought to low voltage and then the inverted signal PRE is brought to high voltage. The pulse defined by the signals PRE, PRE has a length that ensures completion of the above-described pre-charging process of the node Nr. As a result, the PMOS transistors Mpc, Mdb1, Mdb2 and Mu2 are switched off (thereby switching off the comparator 210 as well), and the PMOS transistor Mdb3 is switched on (bringing the voltage at the node Ndb back to the power supply voltage +Vdd).

In the stand-by mode, the discharging block 170 is inactive due to the action of the voltage regulator Mcra, Ira. The NMOS transistor Md3 is on so that the latch Id1, Id2 is set. When the memory device exits from the stand-by mode (time t4), the pre-charging block is disabled and the node Nr is brought to the reference voltage Vref. In particular, the node Nr is discharged through the NMOS transistors MCr, MDr2 and MDr1 (by charge sharing between the capacitors Cr and Cs) towards the voltage:

$$V_{ref} = \frac{Cr \cdot Vpre + Cs \cdot Vs}{Cr + Cs},$$

wherein Vs is the reading voltage (1V). At the same time, the PMOS transistor Mdc1 is switched on and the NMOS transistor Mdc2 is switched off so that the node Ndc is brought (from ground) to the voltage defined by:

$$\frac{Vdd \cdot Rdc2}{Rdc1 + Rdc2}.$$

The voltage divider Rdc1, Rdc2 has a very fast dynamic response due to the fact that it drives a low capacitive load (defined by the non-inverting input terminal of the comparator 215). The resistors Rdc1, Rdc2 are dimensioned so that the voltage at the node Ndc is between the pre-charging voltage Vpre and the reference voltage Vref.

Moreover, the PMOS transistor Mdc is switched on, which supplies the comparator 215. The voltage at its inverting input terminal (node Nr) is higher than the voltage at its non-inverting input terminal (node Ndc), and the node Nres is then kept at low voltage. Therefore, the NMOS transistor Md1 remains off, while the NMOS transistor Md2 is on and the NMOS transistor Md3 is off. The latch Id1, Id2 remains in the set state (node Ndis at high voltage) so that the NMOS transistor Md4 is on and pulls down the node Nr towards ground.

As soon as the voltage at the node Nr falls below the voltage at the node Ndc (time t5), the node Nres is brought to high voltage and the NMOS transistor Md1 is switched on. The latch Id1, Id2 is reset in response thereto (node Ndis at low voltage) and the NMOS transistor Md4 is switched off. The process of returning from the stand-by mode described above is then completed with the node Nr that reaches the reference voltage Vref. Similar considerations apply if the signals have different wave shapes, if the capacitor of the pre-charging block is dimensioned to provide a different starting voltage, if the voltages employed in the pre-charging and discharging blocks have different values, etc.

More generally, the present invention provides a circuit for controlling a reference node in a sense amplifier. The sense amplifier can be switched between an operating mode and a stand-by mode with the reference node that provides a reference voltage in the operating mode. The circuit includes means or circuitry for bringing the reference node to a starting voltage upon entry into the stand-by mode. First means or circuitry are used for keeping the reference node at a pre-charging voltage in the stand-by mode. Second means or circuitry provides a comparison voltage closer to the pre-charging voltage than the starting voltage. Pulling means or circuitry are used for pulling the reference node towards a power supply voltage. Control means or circuitry activates the pulling means upon entry into the stand-by mode and disables the pulling means when the voltage at the reference node reaches the comparison voltage.

The present invention provides for a significant increase in the speed of the pre-charging circuit due to the pull-up action towards the power supply voltage exerted on the reference node. Moreover, the voltage at the reference node is controlled with a feedback scheme. In this way, the pre-charging process has a well-defined behavior. As a result, the circuit of the invention substantially avoids spikes and surges at the reference node upon exiting the stand-by mode.

Additionally, the dynamic response of the sense amplifier is significantly improved in accordance with the invention. This is particularly advantageous when the sense amplifier is used in high performance devices, such as non-volatile memories with a very low access time, for example, even if different applications of the circuit are not excluded.

Still further advantages include, for example, that the reference node is brought to the starting voltage upon entry into the stand-by mode by a capacitor. This feature further improves the dynamic response of the sense amplifier. Moreover, the pre-charging voltage and the comparison voltage are generated by corresponding voltage dividers. The inventive structure is relatively simple, but at the same time quite effective.

Furthermore, the central tap of the second voltage divider is preferably kept at the power supply voltage in the operating mode of the sense amplifier. This further improves the dynamic response of the pre-charging circuit upon entry into the stand-by mode.

It will be appreciated that the present invention may be implemented even without a capacitor by using different structures for generating the pre-charging voltage and the comparison voltage, or by keeping the central tap of the second voltage divider at a different voltage in the operating mode of the sense amplifier. Advantageously, the pulling means (e.g., a pull-up transistor) is controlled by a comparator. The difference between the pre-charging voltage and the comparison voltage is set to an input offset voltage of the comparator.

Another advantageous aspect of the invention is that the voltage at the reference node has already reached its correct value when the pull-up transistor is switched off. Moreover, the second voltage divider and the comparator are disabled after a pre-set period from the entry into the stand-by mode. This significantly reduces the power consumption of the sense amplifier in the stand-by mode once the voltage at the reference node has reached a steady value.

Alternately, the pull-up transistor may be controlled by different elements, the comparison voltage may have a different value, or all the components of the pre-charging block may always be active in the stand-by mode. In one embodiment of the invention, the reference node may be pulled towards a further power supply voltage (e.g., ground) upon exiting the stand-by mode until the voltage at the reference node reaches a further comparison voltage. This ensures that the reference node is brought to the reference voltage very fast upon exiting the stand-by mode.

Advantageously, the means employed for pulling the reference node towards ground (e.g., a pull-down transistor) is controlled by a latch which is switched upon entry into the stand-by mode and when the voltage at the reference node reaches the further comparison voltage. In this way, a very compact structure always keeps the pull-down transistor in the correct condition to discharge the reference node upon exiting the stand-by mode while not otherwise interfering with the operation of the sense amplifier. Yet, the invention is also well suited for implementation with a different structure for controlling the pull-down transistor, generating the further reference voltage in a different manner, or even without any block for pulling the reference node towards ground (or any other power supply voltage) upon exiting the stand-by mode.

The present invention is particularly well suited to control a sense amplifier of a non-volatile memory device, such as a flash EEPROM, for example. This is because the single reference node is associated with a stray capacitor (defined by the whole matrix of memory cells) having a relatively high capacitance of course, other applications are also contemplated and within the scope of the invention. For example, the circuit may be used in an EPROM (where a column of reference cells is associated with each sense amplifier), or even in a different device (such as a sensor).

Naturally, to satisfy local and specific requirements, one skilled in the art will appreciate many modifications and alterations based upon the foregoing description, all of which are included within the scope of protection of the invention as defined by the following claims.

That which is claimed is:

1. A circuit for controlling a voltage at reference node in an amplifier switchable between an operating mode and a stand-by mode, the reference node providing a reference voltage in the operating mode, the circuit comprising:

starting means for providing a starting voltage at the reference node upon entry into the stand-by mode;

first means for providing a pre-charging voltage at the reference node during the stand-by mode;

second means for providing a comparison voltage closer to the pre-charging voltage than the starting voltage;

pulling means for pulling the voltage at the reference node toward a supply voltage; and control means for activating said pulling means upon entry into the standby mode and for disabling said pulling means when the voltage at the reference node reaches the comparison voltage.

2. The circuit according to claim 1 wherein said starting means comprises a capacitor.

3. The circuit according to claim 1 wherein said first means comprises a first voltage divider connected to the supply voltage and including a first central tap for providing the the pre-charging voltage; and wherein said second means comprises a second voltage divider connected to the supply voltage and including a second central tap for providing the comparison voltage.

4. The circuit according to claim 3 further comprising means for keeping the second central tap at the supply voltage during the operating mode.

5. The circuit according to claim 3 wherein said control means comprises a comparator having a first input terminal connected to the first central tap, a second input terminal connected to the second central tap, and an output terminal connected to said pulling means, a difference between the pre-charging voltage and the comparison voltage being substantially equal to an input offset voltage of said comparator.

6. The circuit according to claim 5 further comprising means for disabling said second voltage divider and said comparator a predetermined period after entry into the stand-by mode.

7. The circuit according to claim 1 wherein said pulling means comprises first pulling means, said control means comprises first control means, the comparison voltage comprises a first comparison voltage, and the supply voltage comprises a first supply voltage; and further comprising:

third means for providing a second comparison voltage between the reference voltage and the pre-charging voltage;

second pulling means for pulling the reference node toward a second supply voltage; and second control means for activating said second pulling means upon exiting the stand-by mode and for disabling said second pulling means when the voltage at the reference node reaches the second comparison voltage.

8. The circuit according to claim 7 wherein said second control means comprises:
   a latch switchable between first and a second positions, said latch activating said second pulling in means when in the first position;
   first switching means for switching said latch to the first position upon entry into the stand-by mode; rid
   second switching means for switching said latch to the second position when the voltage at the reference node reaches the second comparison voltage.

9. A circuit for controlling a voltage at a reference node in an amplifier switchable between an operating mode and a standby mode, the reference node providing a reference voltage in the operating mode, the circuit comprising:
   a start-up circuit for providing a starting voltage at the reference node upon entry into the standby mode;
   a first voltage divider for providing a pre-charging voltage at the reference node during the stand-by mode;
   a second voltage divider for providing a comparison voltage;
   a pulling circuit for pulling the voltage at; the reference node toward a supply voltage; and
   a controller for activating said pulling circuit upon entry into the stand-by mode and for disabling said pulling circuit when the voltage at the reference node reaches the comparison voltage.

10. The circuit according to claim 9 wherein said start-up circuit comprises a capacitor.

11. The circuit according to claim 9 wherein said first voltage divider is connected to the supply voltage and includes a first central tap for providing the pre-charging voltage; and wherein said second voltage divider is connected to the supply voltage and includes a second central tap for providing the comparison voltage.

12. The circuit according to claim 11 further comprising a switch for keeping the second central ta at the supply voltage during the operating mode.

13. The circuit according to claim 11 wherein said controller comprises a comparator having a first input terminal connected to the first central tap, a second input terminal connected to the second central tap, and an a output terminal connected to said pulling circuit, a difference between the pre-charging voltage and the comparison voltage being substantially equal to an input offset voltage a said comparator.

14. The circuit according to claim 13 further comprising a disabling circuit for disabling said second voltage divider and said comparator a predetermined period after entry into the stand-by mode.

15. The circuit according to claim 9 wherein said pulling circuit comprises a first pulling circuit, said controller comprises a first controller, the comparison voltage comprises a first comparison voltage, and the supply voltage comprises a first supply voltage; and further comprising:
   a third voltage divider for providing a second comparison voltage between the reference voltage and the pre-charging voltage;
   a second pulling circuit for pulling the reference node toward a second supply voltage; and
   a second controller for activating said second pulling circuit upon exiting the stand-by mode and for disabling said second pulling circuit when the voltage at the reference node reaches the second comparison voltage.

16. The circuit according to claim 15 wherein said second, controller comprises:
   a latch switchable between first and a second positions, said latch activating said second pulling circuit when in the first position; and
   at least one latch controller for switching aid latch to the first position upon entry into the stand-by mode, and for switching said latch to the second position when the voltage at the reference node reaches the second comparison voltage.

17. The circuit according to claim 9 wherein the comparison voltage is closer to the precharging voltage than the starting voltage.

18. An amplifier switchable between an operating mode and a stand-by mode and comprising:
   an input none for receiving an input voltage;
   a reference node for providing a reference voltage during the operating mode;
   a comparator for comparing the input voltage with the reference voltage; and
   a control circuit for controlling the voltage at the reference node comprising
      a start-up circuit for providing a starting voltage at the reference node upon entry into the stand-by mode,
      a first voltage divider for providing a pre-charging voltage at the reference node in iii stand-by mode,
      a second voltage divider for providing comparison voltage;
      a pulling circuit for pulling a voltage at the reference node toward a supply voltage, and
      a controller for activating said pulling circuit upon entry into the stand-by mode and for disabling said pulling circuit when the voltage at the reference node reaches the comparison voltage.

19. The amplifier according to claim 18 wherein the comparison voltage is closer to the pre-charging voltage than the starting voltage.

20. The amplifier according to claim 18 wherein said first voltage divider is connected to the supply voltage and includes a first central tap for providing the pre-charging voltage; and wherein said second voltage divider is connected to the supply voltage and includes a second central tap for providing the comparison voltage.

21. The amplifier according to claim 20 wherein said control circuit further comprises a switch for keeping the second central tap at the supply voltage during the operating mode.

22. The amplifier according to claim 20 wherein said controller comprises a comparator having a first input terminal connected to the first central tap, a second input terminal connected to the second central tap, and an output terminal connected to said pulling circuit, a difference between the pre-charging voltage and the comparison voltage being substantially equal to an input offset voltage of said comparator.

23. The amplifier according to claim 22 wherein said control circuit further comprises a disabling circuit for disabling said second voltage divider and said comparator a predetermined period after entry into the stand-by mode.

24. The amplifier according to claim 18 wherein said pulling circuit comprises a first pulling circuit, said controller comprises a first controller, the comparison voltage comprises a first comparison voltage, and the supply voltage comprises a first supply voltage; and wherein said control circuit further comprises:
   a third voltage divider for providing a second comparison voltage between the reference voltage and the pre-charging voltage;

a second pulling circuit for pulling the reference node toward a second supply voltage; and a second controller for activating said second pulling circuit upon exiting the stand-by mode and for disabling said second pulling circuit when the voltage at the reference node reaches the second comparison voltage.

25. The amplifier according to claim 24 wherein said second controller comprises:

a latch switchable between first and a second positions, said latch activating said second pulling circuit when in the first position; and at least one latch controller for switching said latch to the first position upon entry into the stand-by mode, and for switching said latch to the second position when the voltage at the reference node reaches the second comparison voltage.

26. A non-volatile memory comprising:

a plurality of memory cells;

at least one reference cell; and at least one amplifier for comparing an input voltage provided by one of said memory cells with a reference voltage provided by said at least one reference cell, the at least one amplifier being switchable between an operating mode and a stand-by mode and comprising an input node for receiving an input voltage, a reference node for providing a reference voltage during the operating mode, a comparator for comparing the input voltage with the reference voltage, and a control circuit for controlling the voltage at the reference node comprising a startup circuit for providing a starting voltage, a first voltage divider for providing a pre-charging voltage at the reference node in the stand-by mode, a second voltage divider for providing a comparison voltage, a pulling circuit for pulling a voltage at the reference node toward a supply voltage, and a controller for activating said pulling circuit upon entry into the stand-by mode and for disabling said pulling circuit when the voltage at the reference node reaches the comparison voltage.

27. The non-volatile memory according to claim 26 wherein said first voltage divider is connected to the supply voltage and has a first central tap for providing the pre-charging voltage; and wherein said second voltage divider is connected to the supply voltage and has a second central tap for providing the comparison voltage.

28. The non-volatile memory according to claim 27 wherein said control circuit further comprises a switch for keeping the second central Lap at the supply voltage during the operating mode.

29. The nonvolatile memory according to claim 27 wherein said controller comprises a comparator having a first input terminal connected to the first central tap, a second input terminal connected to the second central tap, and an output terminal connected to said pulling circuit, a difference between the pre-charging voltage and the comparison voltage being substantially equal to an input offset voltage of said comparator.

30. The non-volatile memory according to claim 29 wherein said control circuit further comprises a disabling circuit for disabling said second voltage divider and said comparator a predetermined period after entry into the stand-by mode.

31. The non-volatile memory according to claim 26 wherein said pulling circuit comprises a first pulling circuit, said controller comprises a first controller, the comparison voltage comprises a first comparison voltage, and the supply voltage comprises a first supply voltage; and wherein said control circuit further comprises:

a third voltage divider for providing a second comparison voltage between the reference voltage and the pre-charging voltage;

a second pulling circuit for pulling the reference node toward a second supply voltage; and a second controller for activating said second pulling circuit upon exiting the stand-by mode and to disabling said second pulling circuit when the voltage at the reference node reaches the second comparison voltage.

32. The non-volatile memory according to claim 31 wherein said second controller comprises:

a latch switchable between first and a second positions, said latch activating said second pulling circuit when in the first position; and at least one latch controller for switching said latch to the first position upon entry into the stand-by mode, and for switching said latch to the second position when the voltage at the reference node reaches the second comparison voltage.

33. The non-volatile memory according to claim 26 wherein said plurality of memory cells comprise electrically erasable programmable read only memory (EEPROM) memory cells.

34. The non-volatile memory according to claim 26 wherein the comparison voltage is closer to the pre-charging voltage than the starting voltage.

35. A method for controlling a voltage at reference node in an amplifier switchable between an operating mode and a stand-by mode, the reference node providing a reference voltage in the operating mode, the method comprising:

providing a starting voltage at the reference node upon entry into the stand-by mode;

providing a pre-charging voltage at the reference node during the stand-by mode;

providing a comparison voltage;

activating a pulling circuit for pulling the voltage at the reference node toward a supply voltage upon entry into the stand-by mode; and disabling the pulling circuit when the voltage at the reference node reaches the comparison voltage.

36. The method according to claim 35 wherein the pulling circuit comprises a first pulling circuit, the comparison voltage comprises a first comparison voltage, and the supply voltage comprises a first supply voltage; and further comprising:

providing a second comparison voltage between the reference voltage and the pre-charging voltage;

activating a second pulling circuit tot pulling the reference node toward a second supply voltage upon exiting the stand-by mode; and disabling the second pulling circuit when the voltage at the reference node reaches the second comparison voltage.

37. The method according to claim 35 wherein the comparison voltage is closer to the pre-charging voltage than the starting voltage.

* * * * *

UNITED STATES PATENT AND TRADEMARK OFFICE
CERTIFICATE OF CORRECTION

PATENT NO.    : 6,801,466 B2  
DATED         : October 5, 2004  
INVENTOR(S)   : Salvatore Giove et al.

It is certified that error appears in the above-identified patent and that said Letters Patent is hereby corrected as shown below:

Column 6,  
Line 51, Delete: "SBd, PRE"  
Insert: -- SBd, PRE --

Line 52, Delete: "SBd, PRE"  
Insert: -- SBd, PRE --

Column 7,  
Line 30,  
Delete: "$\dfrac{Vdd \cdot Rdb2}{Pdb1 + Rdb2}$"

Insert: -- $\dfrac{Vdd \cdot Rdb2}{Rdb1 + Rdb2}$ --

Column 13,  
Line 53, delete, "Lap"  
insert -- tap --

Signed and Sealed this

Twelfth Day of April, 2005

JON W. DUDAS  
*Director of the United States Patent and Trademark Office*